US011515278B2

(12) United States Patent
Liao et al.

(10) Patent No.: US 11,515,278 B2
(45) Date of Patent: Nov. 29, 2022

(54) COMMUNICATION INTERFACE STRUCTURE BETWEEN PROCESSING DIE AND MEMORY DIE

(71) Applicants: Global Unichip Corporation, Hsinchu (TW); Taiwan Semiconductor Manufacturing Company, Ltd., Hsinchu (TW)

(72) Inventors: Wei-Chieh Liao, Hsinchu (TW); Igor Elkanovich, Hsinchu (TW); Hung-Yi Chang, Hsinchu (TW); Li-Ken Yeh, Hsinchu (TW); Chung-Ling Liou, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 60 days.

(21) Appl. No.: 17/185,908

(22) Filed: Feb. 25, 2021

(65) Prior Publication Data

US 2022/0270996 A1 Aug. 25, 2022

(51) Int. Cl.
*H01L 25/18* (2006.01)
*H01L 23/00* (2006.01)

(52) U.S. Cl.
CPC .............. *H01L 24/20* (2013.01); *H01L 25/18* (2013.01); *H01L 2924/1433* (2013.01); *H01L 2924/1434* (2013.01)

(58) Field of Classification Search
CPC . H01L 24/20; H01L 25/18; H01L 2924/1433; H01L 25/042; H01L 25/0652; H01L 25/071; H01L 25/072; H01L 25/0753; H01L 2924/1434
See application file for complete search history.

(56) References Cited

U.S. PATENT DOCUMENTS

| 2019/0304912 | A1* | 10/2019 | Ecton ................. H01L 23/5381 |
| 2020/0025615 | A1* | 1/2020 | Spizig .................... G01N 21/65 |
| 2020/0105718 | A1* | 4/2020 | Collins ................... H01L 25/18 |
| 2020/0303327 | A1* | 9/2020 | Elsherbini .............. H01L 25/50 |
| 2020/0303363 | A1 | 9/2020 | Yoo et al. |
| 2021/0028116 | A1* | 1/2021 | Ganesan ........... H01L 23/49822 |

OTHER PUBLICATIONS

"Office Action of Taiwan Counterpart Application", dated Nov. 4, 2021, p. 1-p. 6.

* cited by examiner

*Primary Examiner* — Thanh Y. Tran
(74) *Attorney, Agent, or Firm* — JCIPRNET

(57) ABSTRACT

A communication interface structure for connection between dies is provided, including a memory die, processing dies and interconnection routings. The memory die includes a first interface edge, wherein the first interface edge is split into a plurality of interface groups. Each of the processing dies includes a second interface edge. Interconnection routings respectively connect the second interface edges of the processing dies to the interface groups of the memory die.

10 Claims, 4 Drawing Sheets

COMMUNICATION INTERFACE STRUCTURE BETWEEN PROCESSING DIE AND MEMORY DIE

BACKGROUND

Technical Field

The invention is related to interface between two integrated circuit (IC) dies for data communication and more particularly to a communication interface structure and method between processing die and memory die.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 2.5D semiconductor device, in which several circuit chips may be integrated as a larger integrated circuit, in which the contact elements, interposer or RDL layer are used to connect between the chips.

The packaging technology Integrated Fan-Out (InFO) and chip-on-wafer-on-substrate (CoWoS) have been proposed to package multiple chips assembled side by side.

As to a whole electronic circuit, the main circuit fabricated as a master die in an example may need to connect to multiple slave dies as an example. The master die may be a processing die such as an application specific integrated circuit (ASIC) die, and the slave die may be a memory die, such as high bandwidth memory (HBM). In operation, the HBM die may be shared in use by multiple ASIC dies. Based on the 2.5D package technology, the ASIC dies and the HBM die are connected through an interposer layer or a redistribution layer (RDL). In other words, the interfaces respectively in the ASIC dies and the HBM die include the contact elements, such as the bonding pads or vias. Then, the contact elements are connected to through the interposer or the RDL.

The HBM die usually a relatively large number of communication channels to be accessed by the ASIC dies. Each of various ASIC dies may have different functionality and may just need to access to a part of the HBM die without need to access to the whole HBM die.

To make the HBM dies to be more efficient to communicate with various ASIC dies, the communication interface structure of the interface between the memory die and the processing die needs to be properly designed.

SUMMARY

The invention provides a communication interface structure for connection between dies as to be packaged and connected through the interposer layer or RDL. The interface edge of the memory die such as the HBM die are split into 2 or 2' interface groups, so as to adapt multiple ASIC dies to access to the same memory die. The ASIC die may be same functionality or different. In addition, the ASC dies may have different fabrication quality.

In an embodiment, the invention provides a communication interface structure for connection between dies is provided, including a memory die, processing dies and interconnection routings. The memory die includes a first interface edge, wherein the first interface edge is split into a plurality of interface groups. Each of the processing dies includes a second interface edge. Interconnection routings respectively connect the second interface edges of the processing dies to the interface groups of the memory die.

In an embodiment, the invention provides a communication interface structure for connection between connected dies. The communication interface structure includes a first memory die, including a first interface edge, wherein the first interface edge is split into a plurality of interface groups. In addition, at least one second memory die is included, having a second interface edge. A plurality of processing dies is also included, in which each of the processing dies includes a third interfacing edge and at least one fourth interface edge. A plurality of interconnection routings is connected between the processing dies and the first and second memory dies. The interconnection routings connect each one of the interface groups of the first memory die to the third interface edge of one of the processing dies, wherein the interconnection routings also connect the second interface edge of the second memory die to the fourth interface edge of the one of the processing dies.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention is directed to an interface between two integrated circuit (IC) dies for data communication, in which the communication interface structure between the processing die, such as the ASIC dies and the memory die such as the HBM die are configured. The HBM die has high bandwidth, including 1024 communication channels or even more in an example. The contact elements of the interface of the HBM die as a contact pattern may be configured into a plurality of groups, which are respectively communicated with the ASIC dies. The number of the groups in an embodiment may be 2, 4, 8, . . . , $2^n$, n is an integer.

The contact elements of the two dies are correspondingly connected through connection interface, such as interposer or re-distribution layer (RDL) depending on the package process as taken. The routing structure is embedded in the interposer or the RDL layer. The contact elements may be the contact pad or bump pad in an example.

Several embodiments are provided for describing the invention but the invention is not just limited to the embodiments.

The whole integrated circuit may be fabricated by the semiconductor fabrication processes as a semiconductor device, which may be fabricated based on stack structure of 2.5D semiconductor device. In an embodiment, the interface of the dies to receive data may include the frame decoding circuit in association with the de-serialized circuit. In an embodiment, the interface in semiconductor structure is integrated in the circuit of the whole die. The dies in communication in an embodiment may be a master die of processing circuit and a slave die of memory die. In other words, the types of dies are not limited to the specific type. However, the dies are communicating through the interface with the routing structure, which include a plurality routing paths.

Figure 1:
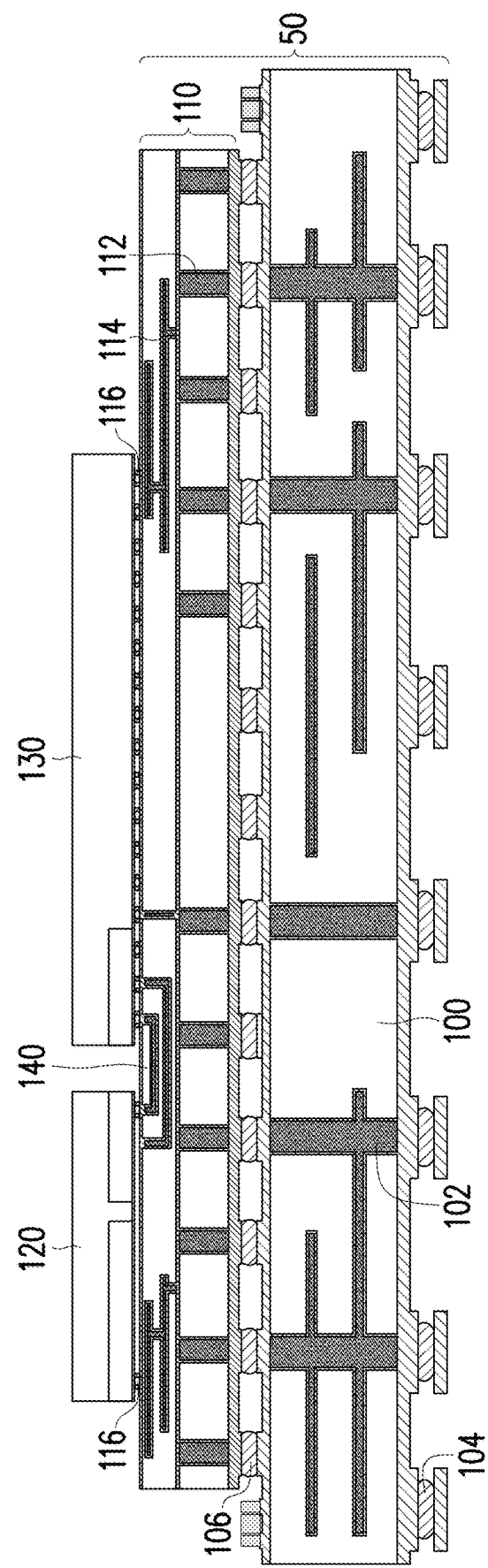
FIG. 1 is a drawing, schematically illustrating a cross-sectional stack structure of 2.5D semiconductor device with an interface, according to an embodiment of the invention.

The general semiconductor fabrication is firstly described. FIG. 1 is a drawing, schematically illustrating a cross-sectional stack structure of 2.5D semiconductor device with an interface, according to an embodiment of the invention. Referring to FIG. 1, in further application, the CoWoS or InFO platform 50 with the intended IC structure is formed based on the 2.5D packaging technology. The CoWoS or InFO platform 50 may include a package substrate 100, which has the bottom solder balls 104 and the top contact elements 106. The via 102 may be used for connecting from the bottom solder balls 104 to the top contact elements 106. Further, a trace layer 110, such as the interposer or RDL, may be further formed on the substrate 100 with the connection of the contact elements 106. The routing structure 140 with the routing paths embedded in the trace layer 110 for connection. The trace layer 110 may also include the Through Silicon Via (TSV) 112, the interconnection routing 114, and the contact elements 116. Here, the contact elements 116 depending on the fabrication process as taken may be via or contact element or any suitable connecting structure for terminal-to-terminal in contact. The invention does not limit the contact elements 106 as a specific type.

In actual application, the CoWoS or InFO platform 50 may also be implemented with additional dies, such as the processing die 130 and memory die 120 or other type of die without limitation to. The processing die 130 and memory die 120 are connected through the routing structure 140 embedded in the trace layer 110.

Figure 2:
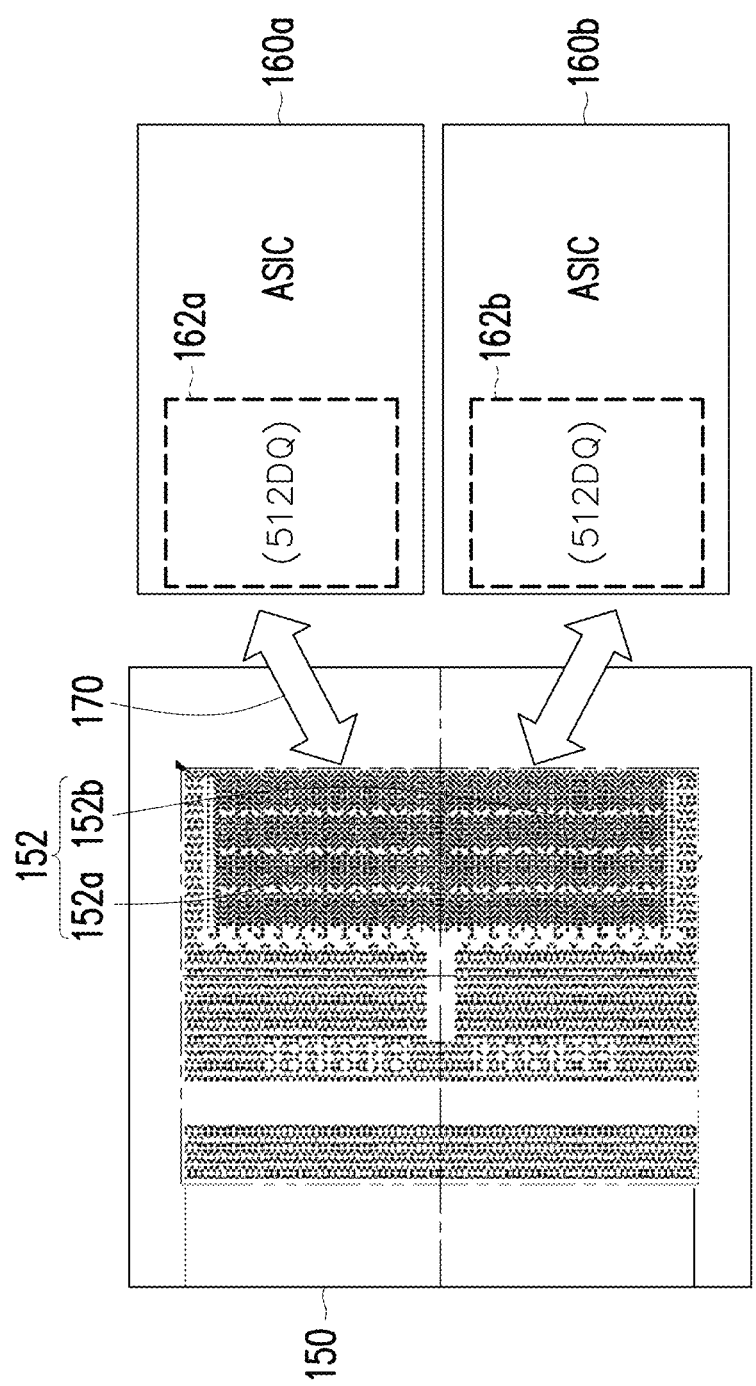
FIG. 2 is drawing, schematically illustrating a routing structure between dies as looked into, according to an embodiment in the invention.

FIG. 2 is drawing, schematically illustrating a routing structure between dies as looked into, according to an embodiment in the invention. Referring to FIG. 2, in an embodiment, to the memory die 150 and the processing dies such as the ASIC dies 160a, 160b, are connected through the interconnection routing 170. The memory die may be shared by multiple ASIC die 160a and 160b, which are in small interface size. The memory die 150 usually includes an interface as a physical layer (PHY). The contact elements of the interface form the interface edge 152, in which each contact element is corresponding to one communication channel, also indicated by one DQ. The number of contact elements in an example is 1024 but the invention is not just limited to this number. In an example, a factor of 1024 may be taken, or 512 channels may be taken. The memory die 150 in an example may be the HBM die with a certain large number of communication channels.

In an embodiment, the interface edge 152 of the memory die in an embodiment may be split into multiple interface groups 152a, 152b, by the number of interface groups being 2, 4, 8, . . . , $2^n$, in which n is a positive integer. As noted, two interface groups 152a, 152b are taken as an example.

Here, the interface groups 152a, 152b are equally split in communication channels. In the embodiment, two ASIC dies 160a, 160b are respectively connected to the interface groups 152a, 152b of the same memory die 150. Again, as to foregoing descriptions, the number of the ASIC dies 160a, 160b is not just limited to 2.

Taking the 1024 channel in total as an example, the ASIC die 160a and the ASIC die 160b has the interface edge 162a and the interface edge 162b by 512 channels (DQ), which is a half of 1024 channels in an example.

In an embodiment, the two ASIC dies 160a, 160b are respectively connected to the memory die 150 at the interface group 152a, 152b through the interconnection routing 170. In this situation, the ASIC dies 160a, 160b may be the same functionality and then the two ASIC dies 160a, 160b form as a single larger ASIC die to communicate with the memory die 150. As to the packaging point of view, the two ASIC dies 160a, 160b are more free in locations with respect to the memory die 150. In fabrication, the cost to fabricate the ASIC dies 160a, 160b in less channel may be reduced while the device element as fabricated need not to have high precision control for condensed circuit elements. In an example, a large photomask is higher in cost than a small photomask.

In an embodiment, the two ASIC dies 160a, 160b may be in different functionality or different in fabrication quality. In this situation, one of the ASIC dies 160a, 160b may be operated in easy function. In fabrication, this ASIC dies may be fabricated with the loose condition in fabrication control, resulting in less cost.

In other words, the memory die 150 may remain the way of design. However, the ASIC dies 160a, 160b may have more flexible condition in fabrication and packaging manner. The depending the number of the interface groups 152a, 152b as split. A minimum number of channels in an example as split is 256 channels.

Figure 3:
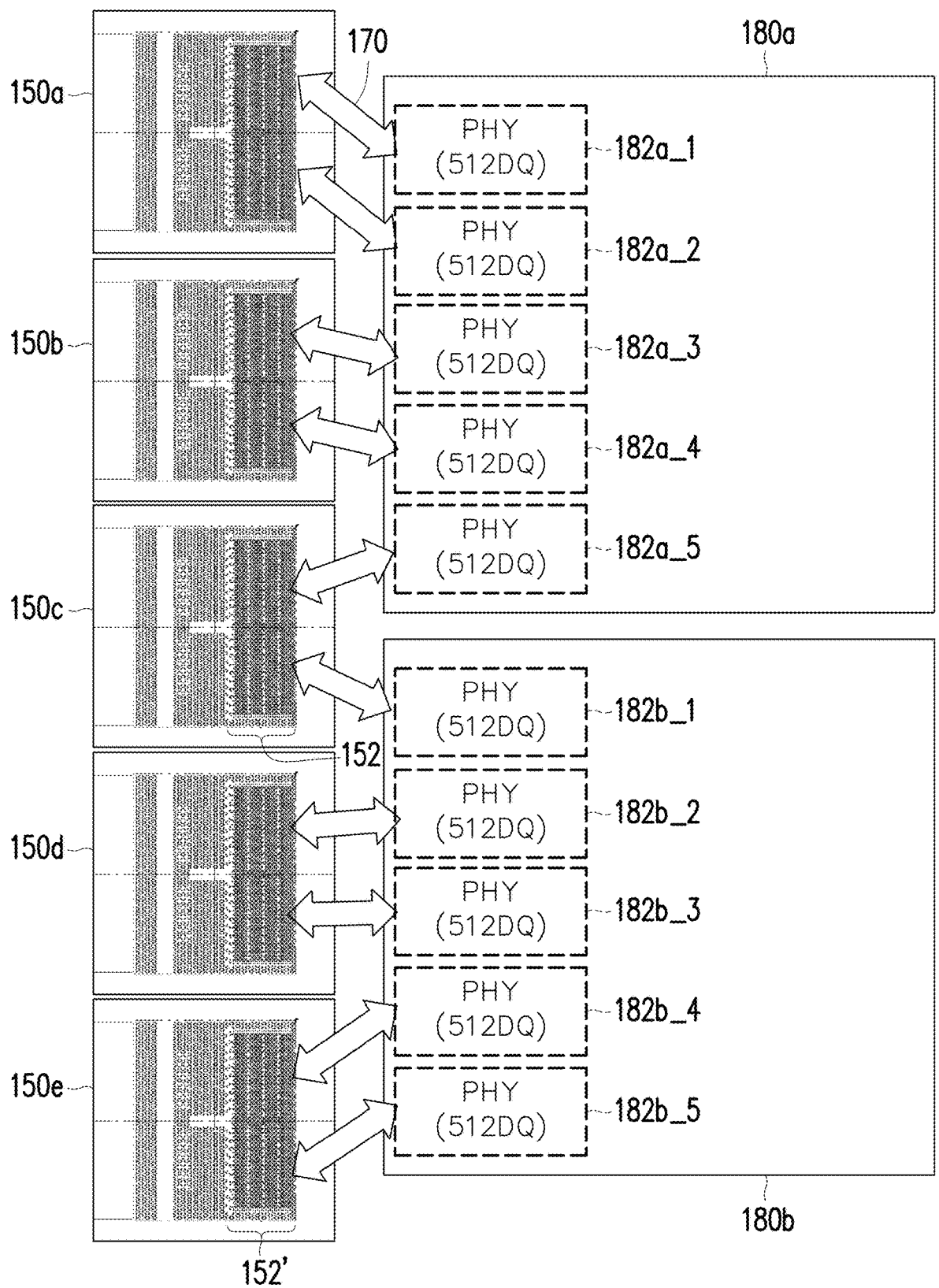
FIG. 3 is drawing, schematically illustrating a routing structure between dies as looked into, according to an embodiment in the invention.

Based on the same aspect in FIG. 2, the mechanism may be further applied to other arrangement. Referring to FIG. 3, a plurality of memory dies 150a, 150b, 150c, 150d, 150e are involved in an embodiment. The memory die 150c may be considered as the one implemented with the mechanism as described in FIG. 2 with the split interface groups in connection the two processing dies 180a, 180b. The other memory dies 150a, 150b, 150d, 150e may be considered as the usual in connection to the interface edge of the same processing die 180a, 180b.

Here, in an embodiment, one processing die 180a may include a plurality of interface edges 182a_1, 182a_2, 182a_3, 182a_4, 182a_5, each of which has 512 DQ channels involved in one physical layer (PHY). 512 DQ channels is a half of 1024 DQ channels as an example for the configuration associating with the memory die 150c. Likewise, one processing die 180b may include a plurality of interface edges 182b_1, 182b_2, 182b_3, 182b_4, 182b_5, each of which has 512 DQ channels, which is a half of 1024 DQ channels as an example. However, the number of the processing dies 180a, 180b associating with the interface edges 182a_5 and 182b_1, as foregoing descriptions, may be 2', depending on the configuration of the memory die 150c in actual application.

The interface edges 182a_1, 182a_2, 182a_3, 182a_4 of the processing die 180a may be connected to the interface groups of the memory dies 150a and the memory die 150b through the interconnection routing 170. To the processing die 180b, the interface edges 182_2, 182b_3, 182b_4, 182b_5 of the processing die 180b may be connected to the interface groups of the memory dies 150d and the memory die 150e through the interconnection routing 170.

However, the channel size of the interface edges 182a_1, 182a_2, 182a_3, 182a_4 of the processing die 180a and the channel size of the interface edges 182_2, 182b_3, 182b_4, 182b_5 of the processing die 180b may need not to be split into 512 DQ.

Figure 4:
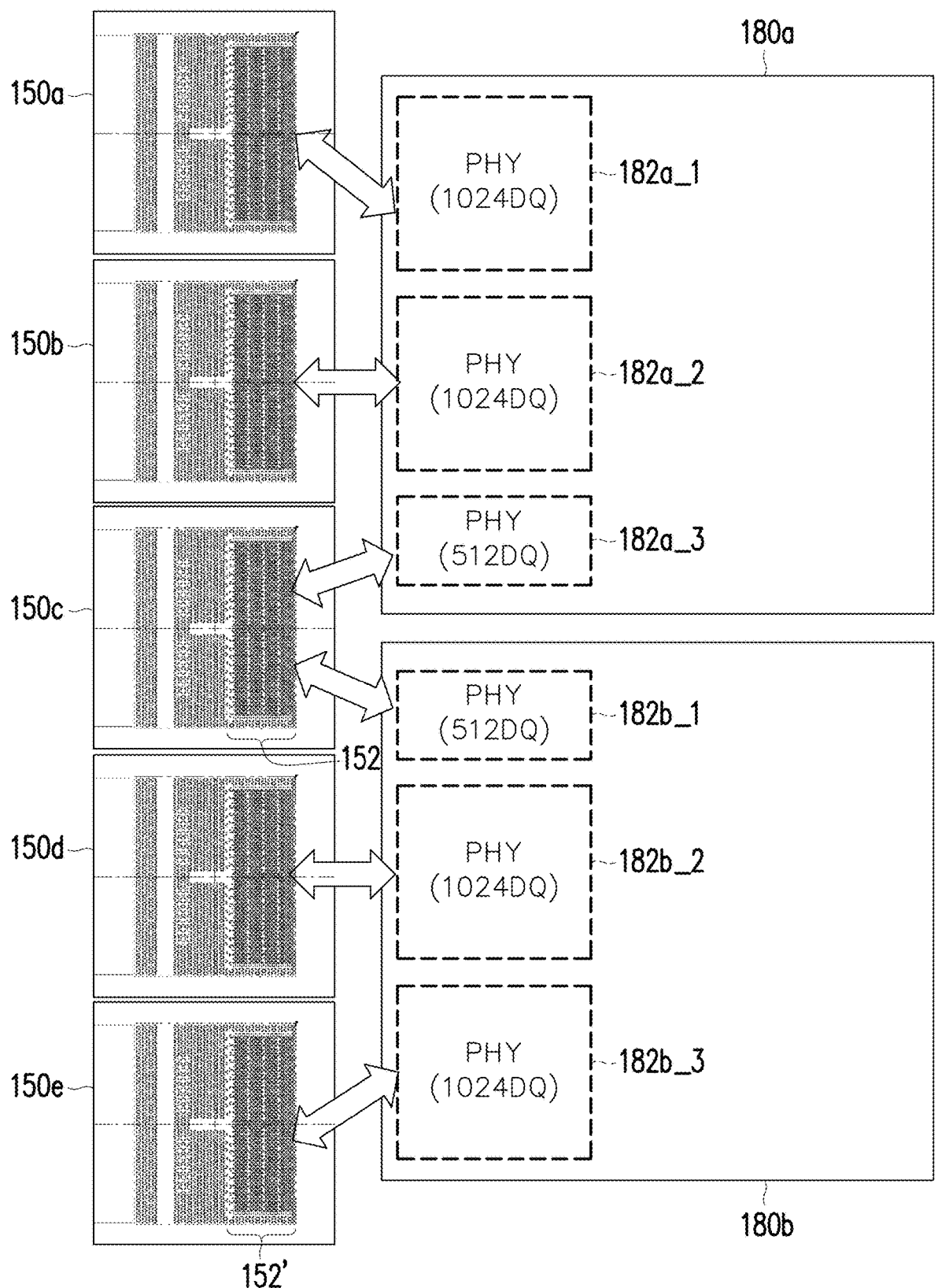
FIG. 4 is a drawing, schematically illustrating a routing structure between dies, according to an embodiment of the invention.

FIG. 4 is a drawing, schematically illustrating a routing structure between dies, according to an embodiment of the invention. Referring to FIG. 4, the interface edges of the memory dies 150a, 150b 150d, 150e other than the memory die 150c, which is split and connected to the processing dies 180a and the processing die 180b, are not split. At the side of the processing dies 180a, 180b, the interface edges 182a_1, 182a_2 of the processing die 180a and the interface edges 182b_2, 182b_3 of the processing die 180b may remain the full channel by 1024 DQ channels. However, the memory die 150c are connected to the two processing dies 180a, 180b, based on the mechanism in forgoing description.

As noted again, the invention is limited to that the memory die 150c are split to the two processing dies 180a, 180b. The memory die 150c may be split into more interface groups as described in FIG. 2. The processing dies 180a, 180b may have more functionality and the addition interface edges may be implemented together with the interface edges 182a_5 and the interface edges 182b_1 in FIG. 3 or the interface edges 182a_3 and the interface edges 182b_1 in FIG. 4.

Generally, in an embodiment, the invention provides a communication interface structure for connection between dies is provided, including a memory die 150, processing dies 160a, 160b and interconnection routings 170. The memory die 150 includes a first interface edge 152, which is split into a plurality of interface groups, such as two interface groups 152a, 152b. Each of the processing dies 160a, 160b includes a second interface edge 162a, 162b. Interconnection routings 170 respectively connect the second interface edges 162a, 162b of the processing dies 160a, 160b to the interface groups 152a, 152b of the memory die 150.

In an embodiment, the invention also provides a communication interface structure for connection between connected dies. The communication interface structure includes a first memory die 150c, including the interface edge 152 as may be referred to a first interface edge, which is split into a plurality of interface groups 152a, 152b. In addition, at least one second memory die 150a, 150b, 150d, 150e is included, having the interface edge as may be referred to a second interface edge 152'. A plurality of processing dies 182a, 182b is also included, in which each of the processing dies 182a, 182b includes a third interfacing edge 182a_5, 182b_1 (see FIG. 3) and at least one fourth interface edge 182a_1, 182a_2, 182a_3, 182a_4, 182b_2, 182b_3, 182b_4, 182b_5. A plurality of interconnection routings 170 is connected between the processing dies 180a, 180b and the first memory die 150c and the second memory dies 150a, 150b, 150d, 150e. The interconnection routings 170 connect each one of the interface groups 152a, 152b of the first memory die 150c to the third interface edge 182a_5, 182b_1 of one of the processing dies 180a, 180b. The interconnection routings 170 also connect the interface edge, as referred to the second interface edge 152' of the second memory dies 150a, 150b, 150d, 150e to the fourth interface edge 182a_1, 182a_2, 182a_3, 182a_4, 182b_2, 182b_3, 182b_4, 182b_5 of the one of the processing dies 180a, 180b.

In an embodiment, as to the communication interface structure, the first interface edge is split into two interface groups and a quantity of the processing dies is two in connection to the two interface groups through the interconnection routings.

In an embodiment, as to the communication interface structure, each of the interface groups or each of the second interface edges has a number of communication channels as a half of a total communication channels of the first interfacing edge.

In an embodiment, as to the communication interface structure, a quantity of the interface groups is an even number.

In an embodiment, as to the communication interface structure, a quantity of the interface groups is $2^n$, wherein n is a positive integer.

In an embodiment, as to the communication interface structure, the processing dies are same function and same quality as fabricated.

In an embodiment, as to the communication interface structure, the processing dies include at least one in different functionality from the other.

In an embodiment, as to the communication interface structure, the processing dies includes at least one in different fabrication quality from the other.

In an embodiment, as to the communication interface structure, the first interface edge includes 1024 communication channels or a factor of 1024 communication channels.

In an embodiment, as to the communication interface structure, the first interface edge and the second interface edge include contact elements arrange in a contact pattern, connected by be correspond one of the interconnection routings.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A communication interface structure for connection between connected dies, comprising:
   a first memory die, including a first interface edge, wherein the first interface edge is split into a plurality of interface groups;
   at least one second memory die, the at least one second memory die including a second interface edge, wherein the second interface edge has a number of communication channels greater than a number of communication channels of each of the interface groups; and
   a plurality of processing dies, each of the processing dies includes a third interface edge and at least one fourth interface edge, wherein each of the fourth interface edge has a number of communication channels greater than a number of communication channels of the third interface edge,
   wherein the third interface edge of each of the processing dies is respectively connected to each of the interface groups of the first memory die through first interconnection routings, and each of the fourth interface edge of each of the processing dies is respectively connected to the second interface edge of each of the second memory die through second interconnection routings.
2. The communication interface structure of claim 1, wherein the first interface edge is split into two interface groups and a quantity of the processing dies is two in connection to the two interface groups through the first interconnection routings.

3. The communication interface structure of claim 2, wherein each of the interface groups has a number of communication channels as a half of a total communication channels of the first interface edge.

4. The communication interface structure of claim 1, wherein the second interface edge of the second memory die is also split into a plurality of interface groups for connection to the fourth interface edge of the processing die.

5. The communication interface structure of claim 1, wherein the second interface edge of the second memory die is not split to multiple groups.

6. The communication interface structure of claim 1, wherein the processing dies are same function and same quality as fabricated.

7. The communication interface structure of claim 1, wherein the processing dies include at least one in different functionality from the other.

8. The communication interface structure of claim 1, wherein the processing dies includes at least one in different fabrication quality from the other.

9. The communication interface structure of claim 1, wherein the first interface edge includes 1024 communication channels or a factor of 1024 communication channels.

10. The communication interface structure of claim 1, wherein the first interface edge and the second interface edge include contact elements arrange in a contact pattern, connected by be correspond one of the interconnection routings.

* * * * *